US008579639B2

(12) United States Patent
Bodmann et al.

(10) Patent No.: US 8,579,639 B2
(45) Date of Patent: Nov. 12, 2013

(54) SYSTEMS AND METHODS FOR COUPLING INPUT/OUTPUT DEVICES

(75) Inventors: Douglas R. Bodmann, Shaker Heights, OH (US); David S. Wehrle, Chesterland, OH (US); Joseph G. Vazach, Mentor, OH (US); Robert J. Kretschmann, Bay Village, OH (US); Nathan J. Molnar, Shaker Heights, OH (US); Gregg M. Sichner, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 13/214,027

(22) Filed: Aug. 19, 2011

(65) Prior Publication Data

US 2012/0045913 A1    Feb. 23, 2012

Related U.S. Application Data

(60) Provisional application No. 61/375,587, filed on Aug. 20, 2010.

(51) Int. Cl.
*H01R 13/62* (2006.01)
(52) U.S. Cl.
USPC .......................................................... 439/155
(58) Field of Classification Search
USPC ......... 439/155, 157, 160, 152, 159, 326, 630, 439/946, 700, 824, 76.1
See application file for complete search history.

(56) References Cited

U.S. PATENT DOCUMENTS

| | | | | |
|---|---|---|---|---|
| 6,288,911 B1 * | 9/2001 | Aoki et al. | ..................... | 361/801 |
| 6,411,505 B1 * | 6/2002 | DiFonzo et al. | ......... | 361/679.38 |
| 6,493,222 B2 * | 12/2002 | DiFonzo et al. | ......... | 361/679.48 |
| 7,476,112 B2 * | 1/2009 | O'Connell et al. | ........... | 439/133 |
| 2001/0036759 A1 * | 11/2001 | Ikemoto et al. | ............... | 439/159 |
| 2002/0072256 A1 * | 6/2002 | Lostoski et al. | ............. | 439/76.1 |
| 2002/0132504 A1 * | 9/2002 | Mori et al. | .................... | 439/160 |
| 2007/0252670 A1 * | 11/2007 | Darr | .............................. | 337/143 |

OTHER PUBLICATIONS

U.S. Appl. No. 13/213,996, filed Aug. 19, 2011, Molnar.
U.S. Appl. No. 13/214,072, filed Aug. 19, 2011, Molnar.
U.S. Appl. No. 13/213,921, filed Aug. 19, 2011, Vazach.
U.S. Appl. No. 13/213,991, filed Aug. 19, 2011, Molnar.
U.S. Appl. No. 13/213,950, filed Aug. 19, 2011, Wehrle.
U.S. Appl. No. 13/214,035, filed Aug. 19, 2011, Kretschmann.

* cited by examiner

*Primary Examiner* — Renee S Luebke
*Assistant Examiner* — Harshad Patel
(74) *Attorney, Agent, or Firm* — Fletcher Yoder, P.C.; R. Scott Speroff; John M. Miller (57) ABSTRACT

An input/output (I/O) device for an automation control system includes a base portion configured to communicatively connect the I/O device with at least one other I/O device, an I/O module physically and communicatively connected to the base portion and comprising I/O communication circuitry, a terminal block physically and communicatively connected to the base portion, and an ejection device configured to eject the I/O module or the terminal block from the base portion by pushing the I/O module or the terminal block out of engagement with the base portion when activated.

12 Claims, 9 Drawing Sheets

SYSTEMS AND METHODS FOR COUPLING INPUT/OUTPUT DEVICES

CROSS REFERENCE TO RELATED APPLICATIONS

This application claims priority of U.S. Provisional Patent Application No. 61/375,587, filed Aug. 20, 2010, which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, or interfacing with input/output (I/O) devices that are configured for coupling and interaction with an automation controller.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar, communication bus, or the like, a terminal block for communicatively coupling the I/O device with field devices, and an I/O module that includes circuitry for performing communication functions and/or logic operations. In traditional automation control systems, the terminal block may be coupled to the base by pushing the terminal block toward the base. Friction or a simple locking mechanism between parts of the terminal block and the base may help prevent the terminal block from disengaging from the base. The terminal block may be removed from the base by pulling the terminal block away from the base. It is now recognized that it is desirable to provide more efficient and effective techniques for coupling, locking, and uncoupling terminal blocks from bases of I/O devices.

BRIEF DESCRIPTION

In one embodiment, an input/output (I/O) device for an automation control system includes a base portion configured to communicatively connect the I/O device with at least one other I/O device, an I/O module physically and communicatively connected to the base portion and comprising I/O communication circuitry, a terminal block physically and communicatively connected to the base portion, and an ejection device configured to eject the I/O module or the terminal block from the base portion by pushing the I/O module or the terminal block out of engagement with the base portion when activated.

In another embodiment, a component of an input/output (I/O) device includes a first connector configured to engage with a second connector of an additional component of the I/O device and an ejection device configured to eject the component from the additional component by disengaging the connector from the second connector. The ejection device includes a plunger configured to contact the additional component and a latch mechanism coupled to the plunger and configured to move the component away from the additional component when the latch mechanism is activated.

In yet another embodiment, a method for coupling and ejecting a component from a base portion of an input/output (I/O) device includes moving the component toward the base portion in a first movement, coupling the component with the base portion, engaging the component with an ejection device disposed in the base portion, activating the ejection device, and moving the component away from the base portion using the ejection device.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

While the present disclosure may be susceptible to various modifications and alternative forms, specific embodiments have been shown by way of example in the drawings and tables and have been described in detail herein. However, it should be understood that the embodiments are not intended to be limited to the particular forms disclosed. Rather, the disclosure is to cover all modifications, equivalents, and alternatives falling within the spirit and scope of the disclosure as defined by the following appended claims. Further, although individual embodiments are discussed herein to simplify explanation, the disclosure is intended to cover all combinations of these embodiments.

Figure 1:
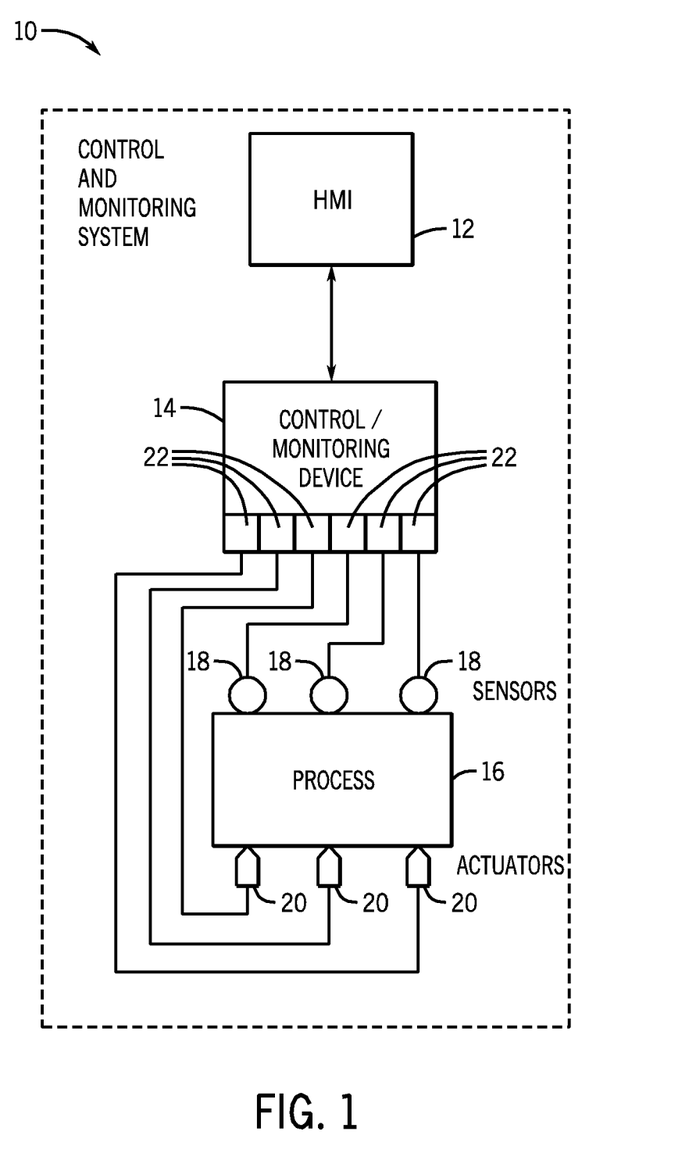
FIG. 1 is a diagrammatical representation of an exemplary control and monitoring system adapted to interface with networked components and configuration equipment in accordance with embodiments of the present techniques.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems. Further, the I/O devices 22 include multiple components that couple together in accordance with present techniques and features that facilitate decoupling.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC logic signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22. In addition, the I/O devices 22 may include several components configured to be coupled together, as described in greater detail below. In various embodiments, the I/O devices 22 may include mechanisms to enable the components to be coupled, ejected, locked, and/or uncoupled from one another.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
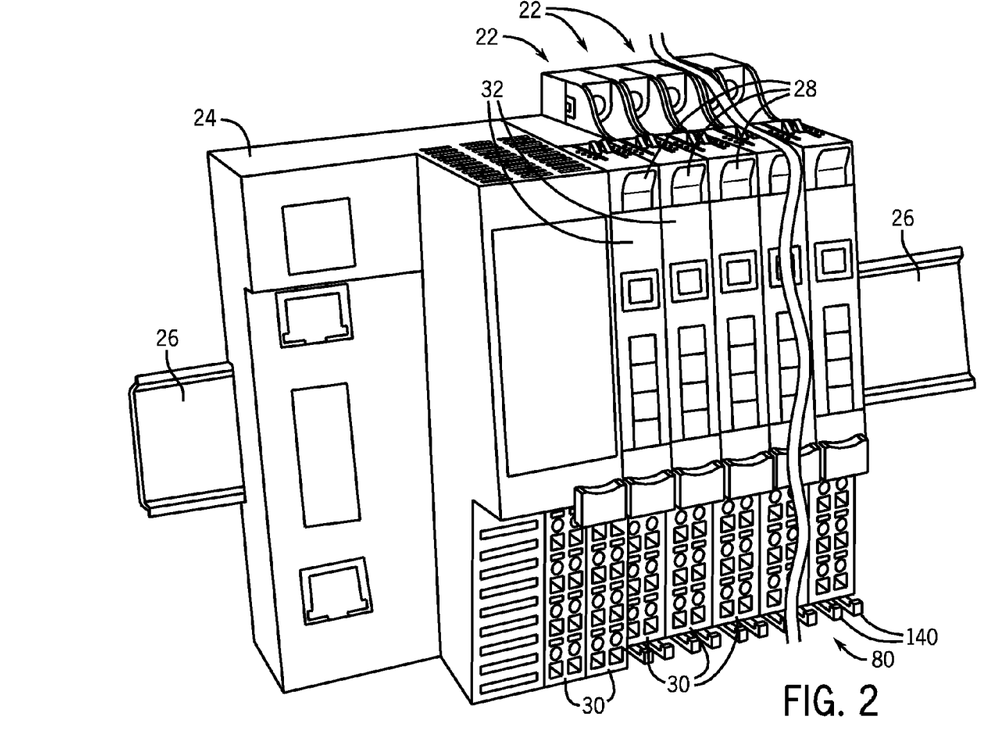
FIG. 2 is a perspective view of a plurality of I/O devices connected to an I/O adapter in accordance with embodiments of the present techniques.

FIG. 2 is a perspective view of a plurality of I/O devices 22 connected to an I/O adapter 24 in accordance with embodiments of the present techniques. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. As described in greater detail below, the plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure.

As also described in greater detail below, each of the I/O devices 22 includes a base 28 for physically and communicatively connecting the I/O device 22 to the DIN rail 26, the I/O adapter 24 and/or adjacent I/O devices 22, a terminal block 30, and one or more I/O modules 32. The terminal block 30 may be used to electrically connect the I/O device 22 to field devices, such as the sensors 18 and actuators 20 illustrated in FIG. 1. In certain embodiments, the terminal block 30 may be removable from the base 28. The I/O modules 32 may include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth. In addition, one or more of the I/O devices 22 includes an ejection device 80 to facilitate ejection of the terminal block 30 and/or I/O module 32 from the base 28, as described in detailed below. For example, the ejection device 80 may be configured to eject the terminal block 30 or the I/O module 32 from the base 28 by pushing the terminal block 30 or the I/O module 32 out of engagement with the base 28. It should be noted that the ejection device 80 may also be configured to facilitate coupling of the terminal block 30 or I/O module 32 to the base 28. In one embodiment, the ejection device 80 engages with the base 28 and the terminal block 30 or I/O module 32 upon coupling of the two components and the act of coupling positions the ejection device 80 for activation. In some embodiments, each of the I/O devices 22 may include a locking mechanism 140 to lock the terminal block 30 or the I/O module 32 to the base 28, as described in detailed below. It should be noted that the locking mechanism 140 may also be configured to facilitate uncoupling of the base 28 and the terminal block 30 or I/O module 32. In one embodiment, the locking mechanism 140 couples the terminal block 30 or the I/O module 32 to the base 28 when in a first position and facilitates the release or ejection of the terminal block 30 or I/O module 32 from the base 28 when in a second position. In further embodiments, the I/O devices 22 may include both the ejection device 80 and the locking mechanism 140.

Figure 3:
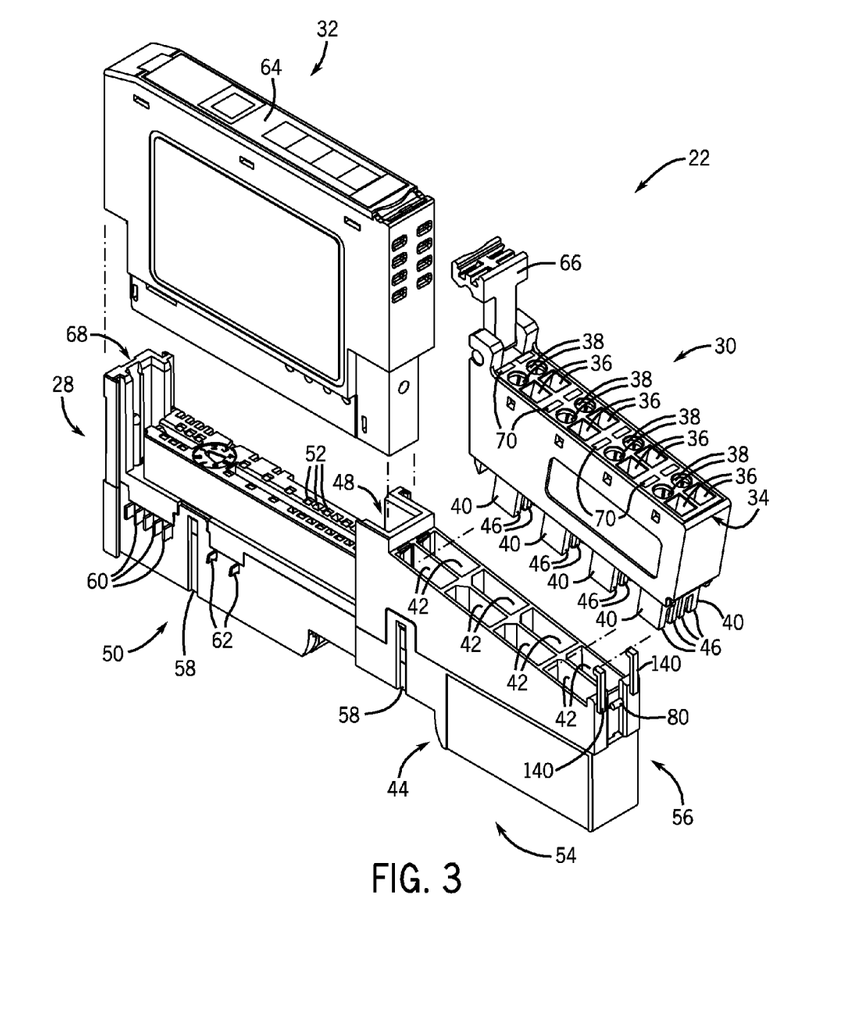
FIG. 3 is an exploded perspective view of an exemplary I/O device that includes an ejection device in accordance with embodiments of the present techniques.

FIG. 3 is an exploded perspective view of an exemplary I/O device 22 with the ejection device 80 and/or the locking mechanism 140 in accordance with embodiments of the present techniques. In the embodiment illustrated in FIG. 3, the terminal block 30 is a removable terminal block that may be physically connected and electrically coupled to the base 28 during assembly of the I/O device 22, and physically disconnected and electrically decoupled during disassembly (e.g., for servicing) of the I/O device 22. The removable nature of the illustrated terminal block 30 enables replacement of the I/O module 32 without the need for re-wiring.

As illustrated, the terminal block 30 includes eight terminals 34 (i.e., channels) for connecting field device wiring to the terminal block 30. Each of the terminals 34 is configured to be associated with a particular input to or output from a field device. As illustrated, each terminal 34 includes a terminal opening 36 into which a field wire electrically connected to a field device may be inserted, and an attachment activator (e.g., a terminal screw) 38, which when activated (e.g., tightened) causes a clamp or other electrical wiring connection mechanism within the terminal block 30 to tighten around an end of a field wire that has been inserted into the associated terminal opening 36. As illustrated, each of the terminals 34 terminates at the bottom of the terminal block 30 with a terminal block connector 40, which may be inserted into terminal block connector openings 42 in the top of a terminal block bay 44 of the base 28 to physically and communicatively connect the terminal block 30 with the base 28. In the illustrated embodiment, each of the terminal block connectors 40 includes two opposing electrical prongs 46 that slide around and electrically connect with a single electrical prong (not shown) in the respective terminal block connector opening 42 of the terminal block bay 44 of the base 28. However, in other embodiments, other types of terminal block connectors 40 may be used to electrically connect with mating electrical connectors in the respective terminal block connector opening 42 of the terminal block bay 44 of the base 28.

The I/O module 32 may also be physically and communicatively connected to the base 28 by inserting the I/O module 32 into a mating slot 48 in an I/O module bay 50 of the base 28. When the I/O module 32 is inserted into the slot 48 in the I/O module bay 50 of the base 28, the I/O module 32 becomes electrically coupled to the terminals 34 of the terminal block 30 via internal circuitry within the base 28 that electrically connects the electrical prongs (or other suitable electrical connectors) in the terminal block connector openings 42 to respective electrical outlets 52 in the top of the I/O module bay 50 of the base 28. The electrical outlets 52 for each channel are in turn electrically coupled to the I/O module 32 via respective electrical connectors (not shown) that, in certain embodiments, extend from the bottom of the I/O module 32. As such, the terminal block 30, the base 28, and the I/O module 32 are all electrically and communicatively coupled together such that signals to and from the field device to which the I/O device 22 is connected are shared between the terminal block 30, the base 28, and the I/O module 32.

In addition, the I/O device 22 may also be electrically coupled to an I/O adapter 24 electrically upstream and/or other I/O devices 22 electrically upstream or electrically downstream via electrical coupling features of the I/O device 22. In certain embodiments, components that are coupled electrically upstream of the I/O device 22 are components that are on a left side 54 of the I/O device 22 when viewing the I/O device 22 from the front, and components that are electrically coupled downstream of the I/O device 22 are components that are on a right side 56 of the I/O device 22 when viewing the I/O device 22 from the front. However, in other embodiments, the upstream and downstream electrical coupling features may be configured differently.

In certain embodiments, adjacent I/O devices 22 may be physically attached to each other via one or more connection features (e.g., slots) 58 of the base 28 on one of the sides (e.g., the left side 54 of the illustrated embodiment) of the I/O device 22 near the bottom of the base 28. Mating connection features such as protrusions (not shown) on the opposite side (e.g., the right side 56 of the illustrated embodiment) of the base 28 of the I/O device 22 near the bottom of the base 28. In certain embodiments, connection features of an I/O device 22 may slide into mating connection features of an adjacent I/O device 22, thereby physically attaching the adjacent I/O devices 22.

When adjacent I/O devices 22 are physically attached to each other, system electrical contacts 60 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. Similarly, field electrical contacts 62 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. In the illustrated embodiment, the I/O device 22 includes five system electrical contacts 60 and two field electrical contacts 62. In such an embodiment, system power may be electrically communicated via electrically connected I/O devices 22 and/or the I/O adapter 24 via two of the system electrical contacts 60, while the three other system electrical contacts 60 are used for transmission of data (e.g., relating to signals transmitted to and from the field devices to which the I/O devices 22 are electrically connected) between the electrically connected I/O devices 22 and the I/O adapter 24. In addition, the two field electrical contacts 62 are used to electrically communicate power to the field devices to which the I/O devices 22 are electrically connected. However, it will be understood that the specific number of system electrical contacts 60 and field electrical contacts 62 may vary between implementations depending on the requirements for power and data transmission of the I/O devices 22.

As illustrated, in certain embodiments, the I/O module 32 may include a status display 64 on the top face of the I/O module 32 for displaying operating status information of the I/O module 32, the base 28, and the terminal block 30. The status display 64 may, for example, include status light emitting diodes (LEDs) corresponding to each of the terminals 34 of the terminal block 30. Further, in certain embodiments, once the terminal block 30 and the I/O module 32 are physically and communicatively connected to the base 28 of the I/O device 22, a latch 66 or other fastening device extending from the terminal block 30 may further attach the terminal block 30 to the I/O module 32, thereby providing additional structural support and stabilizing the electrical connections between the terminal block 30, the I/O module 32, and the base 28.

Figure 4:
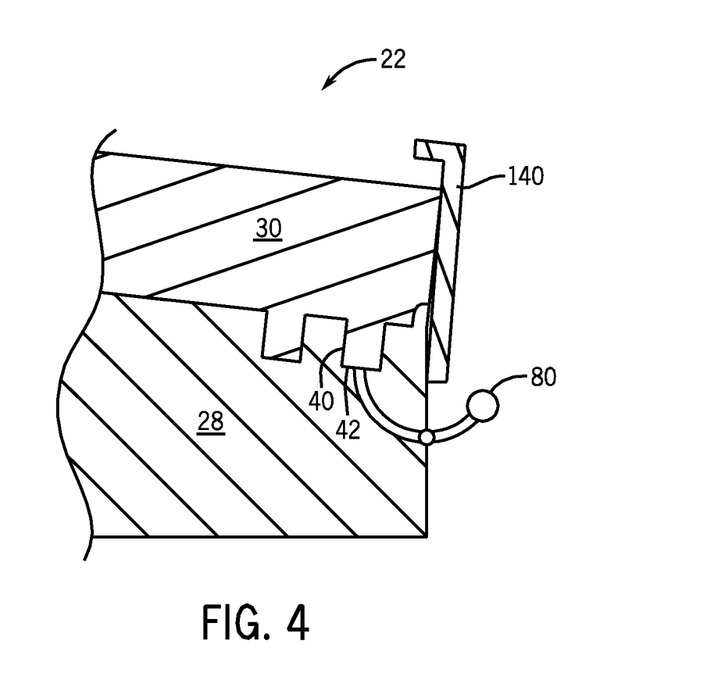
FIG. 4 is a partial side cross-sectional view of an exemplary I/O device including an ejection device and locking mechanism in accordance with embodiments of the present techniques.

FIG. 4 is a partial side cross-sectional view of the I/O device 22 with the ejection device 80 and locking mechanism 140 in accordance with embodiments of the present techniques. As shown in FIG. 4, pushing the ejection device 80 may cause the terminal block connector 40 of the terminal block 30 to become disengaged from the terminal block connector opening 42 of the base 28. Thus, the terminal block 30 may be ejected from the base 28 using the ejection device 80. By using the ejection device 80, the terminal block 30 may be removed from the base 28 without grasping the terminal block 30 or the wires connected to the terminal block 30. Therefore, the ejection device 80 may facilitate removal of the terminal block 30 from the base 28. In addition, the ejection device 80 may be repositioned and used to facilitate removal of the module 32 or other components of the I/O device 22. Further, the ejection device 80 may be disposed in the base 28, the terminal block 30, the module 32, or in other components of the I/O device 22. Various embodiments of the ejection device 80 and their operation are described in more detail below. In the illustrated embodiment, the locking mechanism 140 may block removal of the terminal block 30 from the base 28. Thus, the locking mechanism 140 may help prevent inadvertent removal of the terminal block 30. The locking mechanism 140 may be moved or pushed out of the way when removal of the terminal block 30 is desired. For example, the locking mechanism 140 may be flexible to enable such movement. In further embodiments, the locking mechanism 140 may be used to block removal of the module 32 or other components of the I/O device 22. Various embodiments of the locking mechanism 140 and their operation are described in more detail below.

Figure 5:
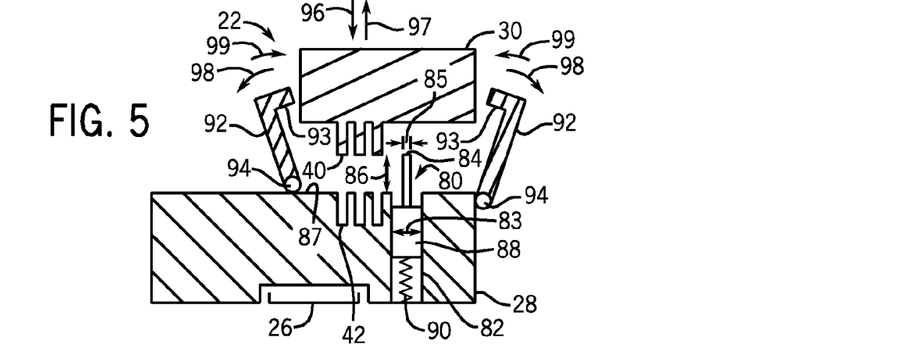
FIG. 5 is a side cross-sectional view of an exemplary I/O device including a terminal block positioned above a base that includes an ejection device in accordance with embodiments of the present techniques.

FIG. 5 is side cross-sectional view of an exemplary I/O device 22 in accordance with embodiments of the present techniques. Specifically, the terminal block 30 is shown positioned above the base 28 prior to being coupled to the base 28. As illustrated, the base 28 includes the ejection device 80. Specifically, the ejection device 80 may include a passage 82 formed in the base 28 along with other features. In certain embodiments, the passage 82 may have a circular cross-sectional shape, a square cross-sectional shape, or any other cross-sectional shape. The ejection device 80 may include components secured in the passage 82 using various methods, such as, but not limited to, adhesives, friction, threaded connections, screwed connections, bolted connections, and so forth. The ejection device 80 may include a plunger 84, which is configured to contact the terminal block 30. In certain embodiments, the plunger 84 may have a circular cross-sectional shape, a square cross-sectional shape, or any other cross-sectional shape. In addition, the plunger 84 may have a diameter 85 less than a diameter 83 of the passage 82. In other embodiments, the diameter 85 of the plunger 84 may be approximately the same as the diameter 83 of the passage 82. As shown in FIG. 5, an exposed portion 86 of the plunger 84 (i.e., a portion outside of the base 28) extends above a top surface 87 of the base 28 when in an ejected mode. The ejection device 80 also includes a latch mechanism 88 and a biasing element 90, which together may determine the ejection characteristics of the ejection device 80. For example, in certain embodiments, the latch mechanism 88 may be configured as a push-push latch mechanism, which may be defined as a latch mechanism that performs a two step operation in which a first step includes engaging a first component with a second component when the first or second component is pushed in a direction, and a second step includes disengaging or releasing the first component from the second component when the first or second component is pushed in the same direction. For example, the push-push latch mechanism may be similar to that used with certain ballpoint pens, and the biasing element 90 may be a spring or other mechanical deflection mechanism. Specifically, the latch mechanism 88 may include cams and/or latches that enable the latch mechanism 88 to operate in a manner described in detail below. Although shown separately in FIG. 5, in certain embodiments, the biasing element 90 may be integral with or internal to the latch mechanism 88. In addition, although shown being used with the terminal block 30 in FIG. 5, in other embodiments, the ejection device 80 may also be used with the module 32.

As shown in FIG. 5, in certain embodiments, the I/O device 22 may also include one or more locking features 92, which may be configured to block the latch mechanism 88 that includes a push-push latch from ejecting the terminal block 30 from the base 28. Specifically, the locking feature 92 may block ejection of the terminal block 30 when in a locked position and enable ejection of the terminal block 30 when in an unlocked position. In one embodiment, the locking feature 92 may be coupled to the base 28 at a hinge 94, which enables the locking feature 92 to rotate away from the terminal block 30 in a direction 98 and toward the terminal block 30 in a direction 99. For example, when coupling the terminal block 30 to the base 28, the terminal block 30 is moved in a direction 96 toward the base 28 and the locking feature 92 may be rotated in the direction 98 to prevent the locking feature 92 from interfering with the coupling of the terminal block 30.

The position of the locking feature 92 rotated in the direction 98 shown in FIG. 5 may correspond to the unlocked position. After the terminal block 30 is coupled to the base, the locking feature 92 may be rotated in the direction 99 to block the latch mechanism 88 from ejecting the terminal block 30 when inadvertently toggled. Specifically, an extension 93 of the locking feature 92 may interfere with movement of the terminal block 30 in a direction 97 away from the base 28. The extension 93 may be a cantilevered portion of the locking feature 92 or any similar hook, catch, or restraint. When uncoupling the terminal block 30 from the base 28, the locking feature 92 may be rotated in the direction 98 and the terminal block 30 moved in the direction 97 away from base 28. In other embodiments, the hinge 94 may be omitted and the locking feature 92 coupled directly to the base 28. In such embodiments, the locking feature 92 may be made from a flexible material, such as plastic. When the terminal block 30 is moved in the direction 96, the terminal block 30 may push the locking feature 92 in the direction 98 to enable coupling of the terminal block 30 to the base 28. Once the terminal block 30 is coupled to the base, the locking feature 92 may move back in the direction 99 to block the removal of the terminal block 30. The locking feature 92 may later be pushed in the direction 98 to enable the terminal block 30 to be removed.

Figure 6:
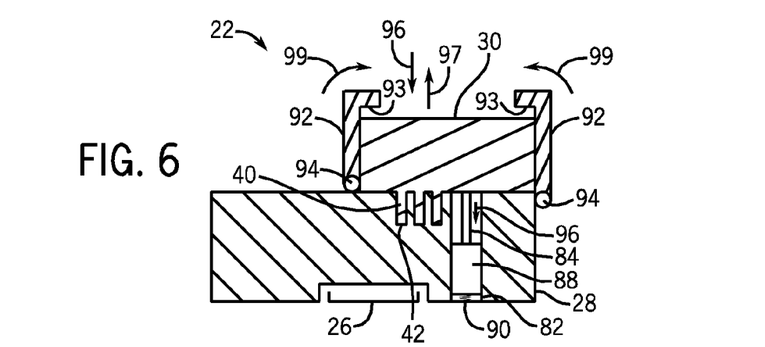
FIG. 6 is a side cross-sectional view of an exemplary I/O device including a terminal block adjacent to a base that includes an ejection device in accordance with embodiments of the present techniques.

FIG. 6 is a side cross-sectional view of the I/O device 22 in accordance with embodiments of the present techniques. As illustrated, the terminal block 30 is adjacent to the base 28. Specifically, the terminal block connectors 40 are engaged with the terminal block connector openings 42. In addition, the terminal block 30 rests against the top surface 87 of the base 28. In other words, the terminal block 30 is pushed completely against the base 28 as the biasing element 90 is compressed. Thus, the terminal block connectors 40 are completely inserted into the terminal block connector openings 42, thereby releasably engaging the terminal block 30 with the base 28. When the latch mechanism 88 includes a push-push latch, the movement of the terminal block 30 toward the base 28 in the direction 96 may correspond to the first step of engaging the terminal block with the base 28. In addition, as shown in FIG. 6, the terminal block 30 has moved the plunger 84 of the ejection device 80 in the direction 96, thereby compressing the spring 90. Moreover, internal latches or cams of the latch mechanism 88 may be engaged by the first step to cause movement of the terminal block in the direction 97, as described in detail below. As shown in FIG. 6, the locking features 92 are rotated toward the terminal block 30 in the direction 99 using the hinges 94. Thus, the extensions 93 of the locking features 92 may block the terminal block 30 from being ejected from the base 28. The position of the locking feature 92 rotated in the direction 99 shown in FIG. 6 may correspond to the locked position.

Figure 7:
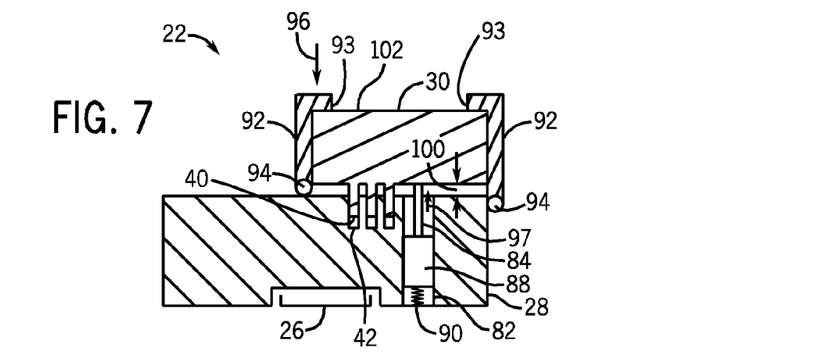
FIG. 7 is a side cross-sectional view of an exemplary I/O device including a terminal block coupled to a base that includes an ejection device in accordance with embodiments of the present techniques.

FIG. 7 is a side cross-sectional view of the I/O device 22 with the terminal block 30 coupled to the base 28 in accordance with embodiments of the present techniques. After the first step of pushing the terminal block 30 against the base 28, the ejection device 80 may push the terminal block 30 away from the base 28 by a distance 100, which may correspond to the length of the exposed portion 86 of the plunger 84. Specifically, the spring 90 may help push the latch mechanism 88 and the plunger 84 in the direction 97 against the terminal block 30. Thus, a top surface 102 of the terminal block 30 may be pushed adjacent the extensions 93 of the locking features 92. In other embodiments, the top surface 102 may not be adjacent the extensions 93 when the latch mechanism 88 pushes against the terminal block 30. In other words, a gap may exist between the top surface 102 and the extensions 93. As shown in FIG. 7, the terminal block connectors 40 are still coupled to the terminal block connector openings 42, thereby providing an electrical connection between the terminal block 30 and the base 28. The configuration of the terminal block 30, ejection device 80, and base 38 shown in FIG. 7 may correspond to a normal position of the terminal block 30. When the latch mechanism 88 includes a push-push latch, the movement of the terminal block 30 toward the base 28 in the direction 96 a second time may correspond to the second step of ejecting the terminal block 30 away from the base 28, provided that the locking features 92 are not engaged. The second step follows the first step. The force used to eject the terminal block 30 from the base 28 may be provided by the spring 90. As described above, by engaging the locking features 92, inadvertent ejection of the terminal block 30 may be avoided. Thus, when the latch mechanism 88 includes the push-push-latch, its use involves movement of the terminal block 30 in the direction 96. During the first step, the terminal block 30 is engaged with the base 28 and is left separated from the base 30 by the distance 100. During the second step, the terminal block 30 is ejected from the base 28, provided that the locking features 92 are not engaged. In other embodiments, other latch mechanisms 88 may be used instead of the push-push latch to eject the terminal block 30 from the base 28. In addition, in further embodiments, the ejection device 80 may be disposed in the terminal block 30 instead of the base 28.

Figure 8:
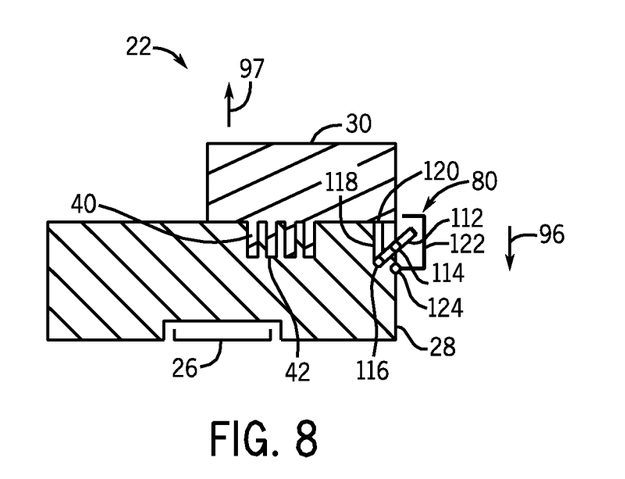
FIG. 8 is a side cross-sectional view of an exemplary I/O device including a terminal block coupled to a base that includes an ejection device with an activation mechanism in accordance with embodiments of the present techniques.

FIG. 8 is a side cross-sectional view of an exemplary I/O device 22 with the terminal block 30 coupled to the base 28 in accordance with embodiments of the present techniques. As illustrated, the ejection device 80 is lever-activated and configured to be used to eject the terminal block 30 from the base 28. Specifically, the ejection device 80 includes an activation mechanism 112 to eject the terminal block 30 when the activation mechanism 112 is activated. As shown in FIG. 8, in certain embodiments, the activation mechanism 112 may be a lever. In other embodiments, the activation mechanism 112 may be a button, switch, knob, dial, or any combination thereof. The activation mechanism 112 enables a person to eject the terminal block 30. Specifically, in the illustrated embodiment, a person may push down on the activation mechanism 112 in the direction 96 to eject the terminal block 30 in the direction 97. In the illustrated embodiment, the ejection device 80 includes a first hinge 114, which may enable movement of the activation mechanism 112 in the direction 96. In addition, the ejection device 80 may include a second hinge 116, which may be coupled to an ejector 118. The second hinge 116 may be configured to enable the ejector 118 to move with respect to the activation mechanism 112. The ejector 118 may be configured to rise out of the base 28 through a passage 120 when the activation mechanism 112 is pushed in the direction 96. In certain embodiments, the base 28 may include a cover 122, which may block access to the ejection device 80. The cover 122 may be coupled to the base 28 via a hinge 124, which may enable the cover 122 to rotate away from the ejection device 80 in the direction 96 when access to the ejection device 80 is desired. Thus, when the cover 122 is rotated in the direction 97, the cover 122 may help prevent inadvertent ejection of the terminal block 30 via the ejection device 80. In certain embodiments, the cover 122 may be removable or omitted entirely. In further embodiments, the activation mechanism 112 may be biased with the ejector 118 in a deployed or retracted position when no terminal block 30 is coupled to the base 28. For example, a spring or similar device may be used to bias the ejector 118 in a position. In addition, although shown being used with the terminal block 30 in FIG. 8, in other embodiments, the ejection device 80 may also be used with the module 32.

Figure 9:
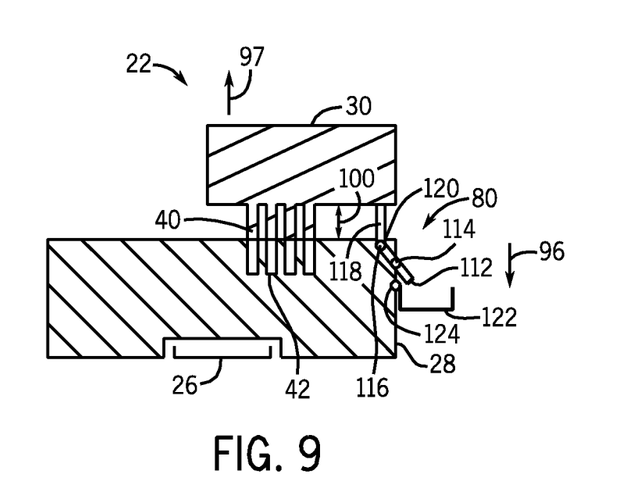
FIG. 9 is a side cross-sectional view of an exemplary I/O device including a terminal block positioned above a base that includes an ejection device with an activation mechanism in accordance with embodiments of the present techniques.

FIG. 9 is a side cross-sectional view of the I/O device 22 with the terminal block 30 positioned above the base 28 in accordance with embodiments of the present techniques. As illustrated in FIG. 9, the ejection device 80, including a lever-activated mechanism, has been used to eject the terminal block 30 from the base 28 in the direction 97. Specifically, the cover 122 has been rotated away from the ejection device 80 in the direction 96 to enable a person to access the activation mechanism 112. As shown, the activation mechanism 112 has been pushed downward in the direction 96, thereby lifting the ejector 118 in the direction 97 against the terminal block 30. Thus, the ejector 118 has pushed the terminal block 30 away from the base 28 by the distance 100, which may indirectly correspond to a length of the ejector 118. As shown in FIG. 9, the terminal block connectors 40 are no longer connected to the terminal block connector openings 42. Thus, the terminal block 30 is not electrically connected to the base 28. In further embodiments, other mechanisms similar to the ejection device 80 may be used to eject the terminal block 30 from the base 28. In addition, the ejection device 80 may be disposed in the terminal block 30 instead of the base 28. Although the activation mechanism 112 is shown moving only in the linear directions 96 and 97 in FIGS. 8 and 9, in other embodiments, the activation mechanism 112 may move in a linear direction, a rotary direction, a curved direction, or any combination thereof.

Figure 10:
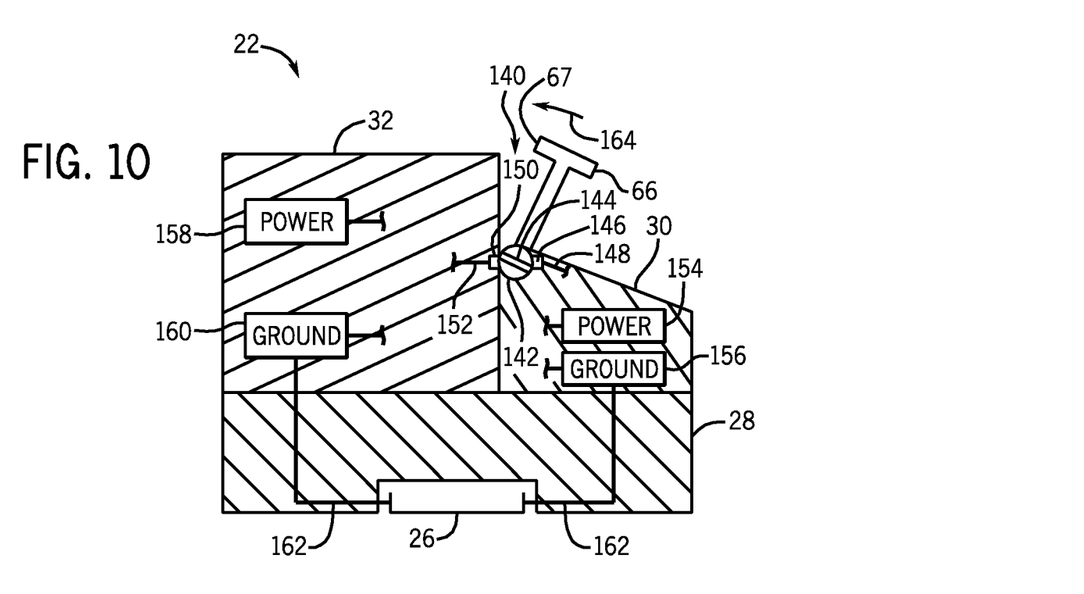
FIG. 10 is a side cross-sectional view of an exemplary I/O device that includes a locking mechanism in an unlocked position in accordance with embodiments of the present techniques.

FIG. 10 is a side cross-sectional view of an exemplary I/O device 22 with the locking mechanism 140 in an unlocked position in accordance with embodiments of the present techniques. As illustrated, the locking mechanism 140 uses the latch 66 to help secure the terminal block 30 to the module 32. Specifically, the latch 66 may include an extension 67 that engages with the module 32 when the latch is moved in a direction 164, as described in detail below. In addition, the locking mechanism 140 may be used to electrically connect the terminal block 30 to the module 32 or to complete a circuit.

Specifically, the terminal block 30 includes a hinge 142 that includes a conducting portion 144. For example, in certain embodiments, the hinge 142 may be made from a non-conducting material, such as plastic. The conducting portion 144 may be made from a conducting material, such as a metal. The terminal block 30 may include a connector 146 adjacent to the hinge 142. The connector 146 may be made from a conductive material, such as a metal. A wire 148 may be connected to the connector 146. Similarly, the module 32 may include a connector 150 adjacent to the hinge 142 and a wire 152 connected to the connector 150.

Further, the terminal block 30 may include a power circuit 154 and/or a ground circuit 156. The power circuit 154 may provide electrical power to the terminal block 30 and the ground circuit 156 may provide a ground path for the terminal block 30. One or more wires 148 may be used to connect the connector 146 to the power circuit 154 and/or the ground circuit 156. Similarly, the module 32 may include a power circuit 158 and a ground circuit 160. One or more wires 152 may be connected to the power circuit 158 and/or the ground circuit 160. Further, a ground wire 162 may be used to connect the ground circuit 160 of the module 32 to the DIN rail 26, which may be connected to a ground. Similarly, the ground wire 162 may be used to connect the ground circuit 156 of the terminal block 30 to the DIN rail 26.

As shown in FIG. 10, the latch 66 is positioned away from the module 32 such that the conductive portion 144 is not aligned with the connectors 146 and 152. Thus, when the latch 66 is rotated away from the module 32, the terminal block 30 is not electrically connected to the module 32. In addition, when the latch is rotated away from the module 32, either the terminal block 30 or the module 32 may be removed from the base 28. In addition, although shown integral with the terminal block 30 in FIG. 10, in other embodiments, the locking mechanism 140 may be integral with the module 32. For example, the locking mechanism 140 may be used to electrically connect the module 32 to the terminal block 30.

Figure 11:
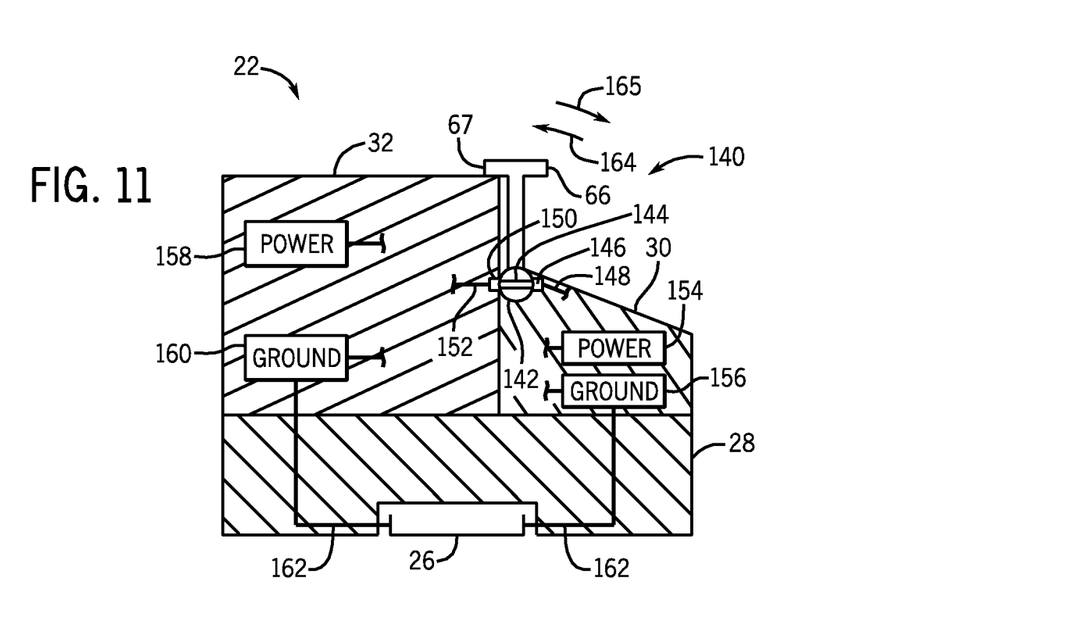
FIG. 11 is a side cross-sectional view of an exemplary I/O device that includes a locking mechanism in a locked position in accordance with embodiments of the present techniques.

FIG. 11 is a side cross-sectional view of the I/O device 22 with the locking mechanism 140 in a locked position in accordance with embodiments of the present techniques. As illustrated, the latch 66 has been rotated in the direction 164 against the module 32. Specifically, the extension 67 of the latch 66 may block removal of the module 32 from the base 28. The extension 67 may be a cantilevered portion of the latch 66 or any similar hook, catch, or restraint. In addition, in certain embodiments, the extension 67 may engage with a tab, notch, or similar connecting feature on the module 32 to help block removal of the terminal block 30 from the base 28. In other words, after the extension 67 has engaged with the connecting feature of the module 32, additional force may be required to move the latch 66 in the direction 165. As shown in FIG. 11, the conducting portion 144 is aligned with the connectors 146 and 150, thereby electrically connecting the terminal block 30 to the module 32. Thus, the power circuit 154 may be electrically connected to the power circuit 158. Similarly, the ground circuit 156 may be electrically connected to the ground circuit 160. In other embodiments, different circuits may be completed or broken by movement of the latch 66. Thus, the locking mechanism 140 may act to both lock the terminal block 30 and/or the module 32, and electrically connect the terminal block 30 to the module 32 when placed in the locked position shown in FIG. 11. To electrically disconnect the terminal block 30 from the module 32, the latch 66 may be moved in the direction 165 away from the module 32, corresponding to the unlocked position shown in FIG. 10. In the unlocked position shown in FIG. 10, the module 32 and/or the terminal block 30 may be removed from the base 28. In other embodiments, other mechanisms similar to the locking mechanism 140 may be used to restrain the terminal block 30 and provide for electrical connection and disconnection from the module 32.

Figure 12:
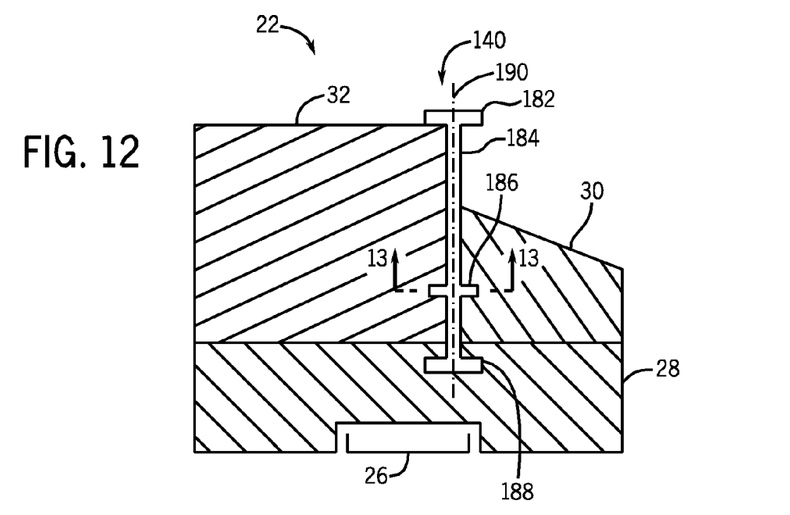
FIG. 12 is a side cross-sectional view of an exemplary I/O device that includes a rotating locking mechanism in accordance with embodiments of the present techniques.

FIG. 12 is a side cross-sectional view of an exemplary I/O device 22 with the locking mechanism 140 configured to rotate in accordance with embodiments of the present techniques. As shown, the locking mechanism 140 is used to secure the terminal block 30 and/or the module 32 to the base 28. The locking mechanism 140 includes a grip 182, which may be used by a person to lock or unlock the locking mechanism 140 by rotating the locking mechanism about an axis 190. The grip 182 may be coupled to a shaft 184, which may be placed between the terminal block 30 and the module 32. In other embodiments, the shaft 184 may be integral with the terminal block 30 and/or the module 32. In certain embodiments, the shaft 184 includes a locking portion 186, which may be used to secure the terminal block 30 and/or the module 32 in a locked position. Specifically, the locking portion 186 may engage with the terminal block 30 and/or the module 32 when in the locked position. The locking mechanism 140 may include a rotating base 188 disposed in the base 28. The rotating base 188 may include bearings or a similar device to enable the locking mechanism 140 to rotate about the axis 190. As described in detail below, the locking mechanism 140 may also be used to electrically connect the terminal block 30 and the module 32.

Figure 13:
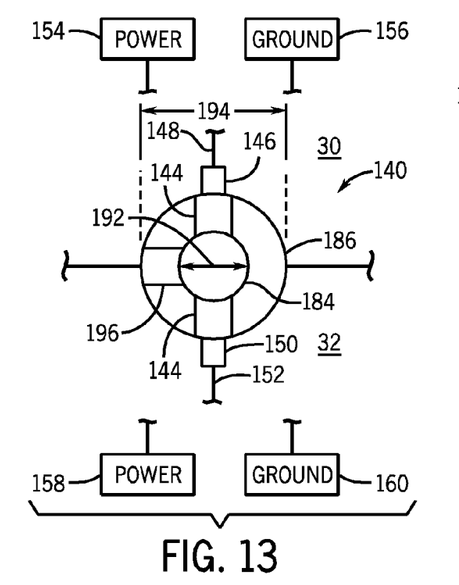
FIG. 13 is a cross-sectional view of an exemplary locking mechanism in an electrically conducting position in accordance with embodiments of the present techniques.

FIG. 13 is cross-sectional view along the line labeled 12-12 in FIG. 12 of an embodiment of the locking mechanism 140 in an electrically conducting position. As shown in FIG. 13, a diameter 192 of the shaft 184 may be less than a diameter 194 of the locking portion 186. In addition, the locking portion 186 may include one or more conducting portions 144, which may be configured to electrically connect with the connectors 146 and/or 150. For example, when the conducting portions 144 are aligned with both the connectors 146 and 150, the power circuits 154 and 158 of the terminal block 30 and the module 32 may be electrically connected to one another. In other embodiments, when the conducting portions 144 are aligned with both the connectors 146 and 150, the ground circuits 156 and 160 may be electrically connected to one another. Thus, the position of the locking portion 186 in FIG. 13 corresponds to an electrically connected configuration of the terminal block 30 and module 32. In certain embodiments, the conducting portions 144 may also lock the terminal block 30 and the module 32 to the base 28. In other words, the conducting portions 144 may block removal of the terminal block 30 and the module 32. In other embodiments, the locking mechanism 140 may include locking devices 196, such as tabs, extensions, notches, or similar mechanisms, that are separate from the conducting portions 144 to lock the terminal block 30 and the module 32 to the base 28. For example, in the illustrated embodiment of FIG. 13, the locking mechanism 140 includes two conducting portions 144 and one locking device 196 arranged in a T-shaped configuration. Specifically, the locking device 196 is located in between the two conducting portions 144. As shown in FIG. 13, the two conducting portions 144 are aligned with the connectors 146 and 150 to electrically connect the terminal block 30 and the module 32, and to physically block removal of both the terminal block 30 and the module 32. The locking device 196 is used to block removal of only one of the terminal block 30 and the module 32, as described in detail below. In further embodiments, different numbers and/or arrangements of the conducting portions 144 and the locking devices 196 may be used depending on the particular arrangement and requirement of the I/O device 22.

Figure 14:
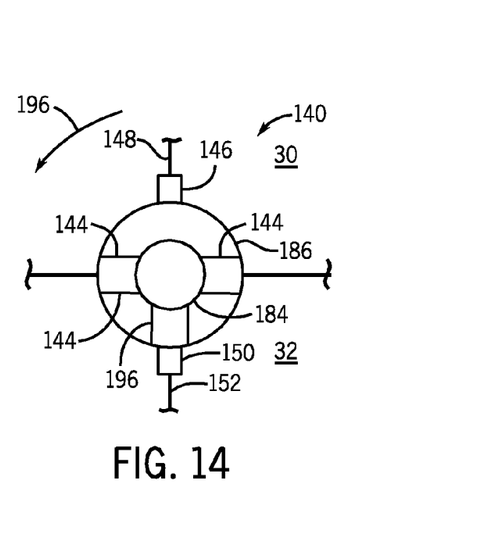
FIG. 14 is a cross-sectional view of an exemplary locking mechanism in an electrically non-conducting position in accordance with embodiments of the present techniques.

FIG. 14 is a cross-sectional view along the line labeled 12-12 in FIG. 12 of the locking mechanism 140 in an electrically unconnected configuration. As shown in FIG. 14, the locking mechanism 140 is rotated 90 degrees in the direction 196 with respect to the electrically connected configuration shown in FIG. 13. Thus, the two conducting portions 144 are not aligned with the connectors 146 and 150. Instead, the locking device 196 is aligned with the connector 150 of the module 32. No conducting portion 144 or locking device 196 is aligned with the connector 146 of the terminal block 30. Thus, the terminal block 30 and the module 32 are not electrically connected to one another. In other words, FIG. 14 represents the electrically unconnected configuration of the locking mechanism 140. In addition, the terminal block 30 may be removed from the base 28 because no conducting portion 144 or locking device 196 is blocking removal of the terminal block 30. In addition, with the locking mechanism 140 in the electrically unconnected configuration, the terminal block 30 may be coupled to the base 28 if not already present. However, the locking device 196 is aligned with the connector 150, thereby blocking removal of the module 32 from the base 28. After the terminal block 30 is removed from the base 28, the locking mechanism 140 may be rotated 180 degrees such that no conducting portion 144 or locking device 196 is aligned with the connector 150. Thus, the module 32 may be removed from the base 28 or inserted if no module 32 was already present. In other words, the locking mechanism 140 may be used to both lock the terminal block 30 and/or the module 32 to the base 28, and to electrically connect the terminal block 30 to the module 32. Further, the configuration of the locking mechanism 140 with two conducting portions 144 and one locking device 196 shown in FIG. 14 may be used to selectively remove or lock the terminal block 30 and the module 32 one at a time. In certain embodiments, the locking device 196 may be omitted to enable the terminal block 30 and the module 32 to be removed or locked simultaneously. In other embodiments, other configuration and motions of the locking mechanism 140 may be used to couple the terminal block 30 and/or the module 32 to the base 28, and to electrically connect the terminal block 30 to the module 32.

Figure 15:
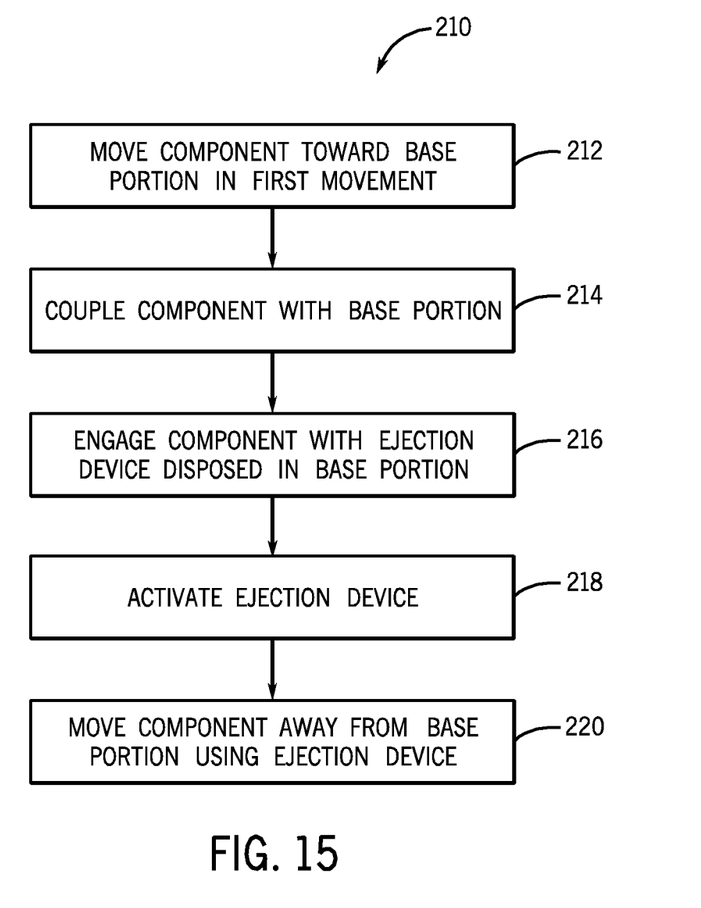
FIG. 15 is a flow chart of a process for operating an ejection device of an exemplary I/O device in accordance with an embodiment of the present technique.

FIG. 15 is a flow chart of a process 210 for operating the ejection device 80 of the I/O device 22 in accordance with an embodiment of the present technique. In a first step 212, a component of the I/O device 22, such as the terminal block 30 or the module 32, is moved toward the base 28 in a first movement. In a second step 214, the component couples with the base 28. For example, the terminal block connectors 40 of the terminal block 30 may be inserted into the terminal block connector openings 42 of the base 28. In a third step 216, the component engages with the ejection device 80, which may be disposed in the base 28. In certain embodiments, the third step 216 may occur simultaneously with the second step 214. In a fourth step 218, the ejection device 80 is activated. For example, the component may be moved toward the base 28 in a second movement to activate the latch mechanism 88 when configured with a push-push latch. In other embodiments, the activation mechanism 112 may be pushed to activate the ejection device 80. In a fifth step 220, the component is moved away from the base 28 using the ejection device 80. For example, the biasing element 90 of the ejection device may push the component out of engagement with the base 28 using the plunger 84 of the ejection device 80. In other embodiments, the ejector 118 may push the component away from the base 28 as the activation mechanism 112 is pushed. In further embodiments, locking features 92 and/or locking mechanisms 140 may be used to block the component from being disengaged from the base 28. In some embodiments, the locking mechanism 140 may include conducting portions 144 to enable the terminal block 30 to be electrically connected to the module 32 and/or the base when the locking mechanism 140 is in the locked position. Use of the various techniques described above may facilitate removal of the component from the base and/or help block inadvertent removal of the component from the base.

While only certain features of the invention have been illustrated and described herein, many modifications and changes will occur to those skilled in the art. For example, while locking and ejection features are illustrated on specific components of an I/O device in the figures described above, in other embodiments, such features may be incorporated with other or additional components of an I/O device. It is, therefore, to be understood that the appended claims are intended to cover all such modifications and changes as fall within the true spirit of the invention.

The invention claimed is:

1. An input/output (I/O) device for an automation control system, the I/O device comprising:
   a base portion configured to communicatively connect the I/O device with at least one other I/O device;
   an I/O module physically and communicatively connected to the base portion and comprising I/O communication circuitry;
   a terminal block physically and communicatively connected to the base portion, wherein the base portion communicates signals between the I/O module and the terminal block during operation; and an ejection device comprising a push-push latch mechanism configured to releasably engage the I/O module or the terminal block with the base portion when the I/O module or the terminal block is moved in a first direction such that the I/O module or the terminal block is interlocked with the base portion and configured to eject the I/O module or the terminal block from the base portion by pushing the I/O module or the terminal block out of engagement with the base portion when activated by the I/O module or the terminal block being subsequently moved in the first direction such that the I/O module or the terminal block is released from the base portion.

2. The I/O device of claim 1, wherein the ejection device is disposed in the I/O module, terminal block, or the base portion.

3. The I/O device of claim 1, wherein the push-push latch mechanism comprises a mechanical deflection mechanism to eject the I/O module or the terminal block.

4. The I/O device of claim 1, comprising a locking feature configured to block the push-push latch mechanism from ejecting the I/O module or the terminal block when the locking feature is in a locked position.

5. The I/O device of claim 1, comprising a cover configured to block access to the ejection device.

6. The I/O device of claim 5, wherein the cover is removable.

7. The I/O device of claim 1, wherein the I/O communication circuitry of the I/O module is configured to perform communication functions, logic operations, or a combination thereof.

8. A component of an input/output (I/O) device, the component comprising:

a first connector configured to engage with a second connector of an additional component of the I/O device, wherein signals are communicated between the component and the additional component during operation; and an ejection device configured to eject the component from the additional component by disengaging the first connector from the second connector, wherein the ejection device comprises:

a plunger configured to contact the additional component; and a latch mechanism coupled to the plunger and configured to move the component away from the additional component when the latch mechanism is activated.

9. The component of claim 8, wherein the ejection device comprises an activation mechanism coupled to the latch mechanism and configured to activate the latch mechanism.

10. The component of claim 8, wherein the latch mechanism is configured to be activated when the component is moved toward the additional component.

11. The component of claim 8, wherein the latch mechanism comprises a push-push latch mechanism configured to releasably engage the component with the additional component when the component is moved in a first direction such that the component is interlocked with the additional component and configured to eject the component from the additional component when the component is moved in the first direction such that the component is released from the additional component.

12. The component of claim 8, comprising a locking feature configured to block the ejection device from ejecting the component.

* * * * *